United States Patent
Kojori

(10) Patent No.: US 7,615,989 B2
(45) Date of Patent: Nov. 10, 2009

(54) METHOD AND APPARATUS FOR DC INTEGRATED CURRENT SENSOR

(75) Inventor: Hassan Ali Kojori, Mississauga (CA)

(73) Assignee: Honeywell International Inc., Morristown, NJ (US)

( * ) Notice: Subject to any disclaimer, the term of this patent is extended or adjusted under 35 U.S.C. 154(b) by 248 days.

(21) Appl. No.: 11/716,572

(22) Filed: Mar. 12, 2007

(65) Prior Publication Data

US 2008/0084200 A1 Apr. 10, 2008

Related U.S. Application Data

(60) Provisional application No. 60/849,786, filed on Oct. 6, 2006.

(51) Int. Cl.
*G01R 15/18* (2006.01)
(52) U.S. Cl. .............. 324/127; 324/117 R; 324/117 H
(58) Field of Classification Search .............. 324/126, 324/127, 117 R; 327/307–317
See application file for complete search history.

(56) References Cited

U.S. PATENT DOCUMENTS

| | | | |
|---|---|---|---|
| 2,605,302 A | 7/1952 | Specht | |
| 3,739,274 A * | 6/1973 | DePuy | 324/120 |
| 3,881,149 A * | 4/1975 | Kiko | 323/356 |
| 4,278,930 A | 7/1981 | Rogers | |
| 4,628,265 A * | 12/1986 | Johnson et al. | 324/329 |
| 4,713,604 A * | 12/1987 | Becker et al. | 324/500 |
| 4,810,954 A * | 3/1989 | Fam | 324/142 |
| 4,928,059 A | 5/1990 | Franklin et al. | |
| 4,952,853 A | 8/1990 | Archer | |
| 5,041,780 A | 8/1991 | Rippel | |
| 5,053,688 A | 10/1991 | Rees | |
| 5,293,121 A | 3/1994 | Estes, Jr. | |
| 5,473,244 A * | 12/1995 | Libove et al. | 324/126 |
| 5,475,301 A | 12/1995 | Kawakami et al. | |
| 5,486,756 A | 1/1996 | Kawakami et al. | |
| 5,539,354 A * | 7/1996 | Carsten | 327/559 |
| 5,656,929 A | 8/1997 | Humpherys | |
| 5,696,430 A | 12/1997 | Erdman et al. | |
| 5,838,132 A | 11/1998 | Tanaka | |
| 5,910,743 A * | 6/1999 | Baskin | 327/172 |
| 6,366,076 B1 | 4/2002 | Karrer et al. | |
| 6,496,011 B2 * | 12/2002 | Kloeckner | 324/500 |
| 6,566,856 B2 | 5/2003 | Sandquist et al. | |
| 6,621,259 B2 | 9/2003 | Jones et al. | |
| 6,661,217 B2 * | 12/2003 | Kimball et al. | 324/76.41 |
| 6,744,250 B2 | 6/2004 | Hauenstein | |
| 6,781,359 B2 | 8/2004 | Stauth et al. | |
| 6,992,473 B2 | 1/2006 | Marschalkowski et al. | |
| 7,362,086 B2 * | 4/2008 | Dupuis et al. | 324/127 |
| 2004/0183522 A1 | 9/2004 | Gunn et al. | |
| 2006/0158158 A1 | 7/2006 | Eberlein | |

OTHER PUBLICATIONS

Hua et al., 2006, "Design Considerations of Time Constant Mismatch Problem for Inductor DCR Current Sensing Method", IEEE Jun. 2006 pp. 1368-1374.

\* cited by examiner

*Primary Examiner*—Ha Tran T Nguyen
*Assistant Examiner*—Richard Isla Rodas
(74) *Attorney, Agent, or Firm*—Oral Caglar, Esq.

(57) ABSTRACT

Integrated current sensors are used in DC electric power systems. An integrated current sensor (200B) according to one embodiment comprises: a DC inductor (111B) including a resistive component and an inductive component, wherein a DC current passes through the DC inductor (111B); an integrator circuit (161), the integrator circuit (161) receiving a voltage associated with the DC inductor (111B); and a feedback system operationally connected to the DC inductor (111B) and to the integrator circuit (161), to subtract a voltage associated with the resistive component and obtain a voltage associated with the inductive component.

16 Claims, 11 Drawing Sheets

METHOD AND APPARATUS FOR DC INTEGRATED CURRENT SENSOR

The present application claims priority under 35 USC §119 (e) to U.S. Provisional Application No. 60/849,786 filed Oct. 6, 2006, which is hereby incorporated by reference herein in its entirety.

CROSS REFERENCE TO RELATED APPLICATIONS

This non-provisional application is related to co-pending non-provisional application titled "Method and Apparatus for AC Integrated Current Sensor" filed concurrently herewith, the entire contents of which are hereby incorporated by reference.

BACKGROUND OF THE INVENTION

1. Field of the Invention

The present invention is related to electric power systems, and more particularly to a method and apparatus for integrating a DC current sensor with a DC inductor.

2. Description of the Related Art

DC current sensors are essential components for many electric power systems. DC current sensors determine current magnitude and direction at various circuit locations; facilitate proper control, protection and/or monitoring of the overall electrical system; etc. In particular, in a More Electric Aircraft (MEA) architecture, a large number of stand-alone current sensors are used, in addition to various common-mode and differential-mode inductors, as required for the power topology and/or for proper Electromagnetic Interference (EMI) and Power Quality mitigation.

Typical/conventional standalone current sensors and inductors are heavy and expensive, and need to be used together with bus-bars, cables, and other mounting fixtures inside a circuit. For each typical/conventional current sensor employed in an electric power system, the system is disturbed at two different places, where the current sensor contacts are connected to the electric power system. Hence, installation of typical/conventional current sensors in electric power systems causes significant disturbances. Typical/conventional current sensors also require proper thermal management. Hence, additional parts are needed with typical/conventional current sensors, which reduces reliability and adds extra weight, volume, cost and complexity to electrical circuits.

Disclosed embodiments of this application address these and other issues by integrating a DC inductor/choke with a current sensor, or by modifying a DC inductor to measure DC current in the same integrated package. Methods and apparatuses of the present invention implement the functions of inductor and current sensor in one integrated package. In one embodiment, a DC inductor is combined with an integrator, a gain control circuit, and a feedback loop, to obtain an integrated DC inductor/current sensor that performs both inductive and current sensing functions. The integrated DC inductor/current sensor outputs a voltage proportional to an input current through the inductor, or a current equal to the input current through the inductor. In another embodiment, a DC integrated inductor/current sensor includes two windings around a magnetic core, and outputs a current equal to the current through a first winding, and/or a voltage proportional to the current through the first winding. In other embodiments, typical/conventional current sensors are integrated with DC inductors into one package. The integrated DC inductor/current sensors of the current invention have wide current/temperature operating range, are lightweight and cost-effective, and provide highly accurate current measurements.

SUMMARY OF THE INVENTION

The present invention is directed to integrated current sensors for use in DC electric power systems. According to a first aspect of the present invention, an integrated current sensor for use in a DC electric power system comprises: a DC inductor including a resistive component and an inductive component, wherein a DC current passes through the DC inductor; an integrator circuit, the integrator circuit receiving a voltage associated with the DC inductor; and a feedback system operationally connected to the DC inductor and to the integrator circuit, to subtract a voltage associated with the resistive component and obtain a voltage associated with the inductive component.

According to a second aspect of the present invention, an integrated current sensor for use in a DC electric power system comprises: a DC inductor including a resistive component and an inductive component, wherein a DC current passes through the DC inductor; an integrator circuit operationally connected to the DC inductor, the integrator circuit outputting an electrical parameter proportional to the DC current; and a feedback circuit connected to the integrator circuit, to obtain a voltage associated with the inductive component.

According to a third aspect of the present invention, an integrated current sensor for use in a DC electric power system comprises: a magnetic core; a first winding wound around the core, the first winding carrying a DC current; a second winding wound around the core, the second winding carrying a current proportional to the DC current; and terminals connected to the first or second winding, to output a voltage proportional to the DC current.

According to a fourth aspect of the present invention, an integrated current sensor for use in a DC electric power system comprises: a DC inductor, wherein a DC current passes through the inductor; and one current sensor selected from the group consisting of a transductor, a Hall Effect current sensor, a shunt resistor, and a non-contact current sensor, wherein the current sensor and the inductor are packaged into a single package.

According to a fifth aspect of the present invention, an integrated current sensor for use in a DC electric power system comprises: a DC inductor, wherein a DC current passes through the DC inductor; a signal conditioning unit operationally connected to the DC inductor, the signal conditioning unit digitizing a second voltage proportional to a first voltage associated with the DC inductor, and outputting a third voltage; and a data processing unit inputting the third voltage, wherein the data processing unit performs integration for the third voltage, and outputs at least one signal for control, protection, or Prognostics Health Monitoring.

BRIEF DESCRIPTION OF THE DRAWINGS

Further aspects and advantages of the present invention will become apparent upon reading the following detailed description in conjunction with the accompanying drawings, in which.

DETAILED DESCRIPTION

In one aspect, the present invention relates to methods and apparatuses that achieve functions for DC current sensing applications as well as inductive functions, and implement integrated DC inductor/current sensors.

Traditional secondary power distribution systems require measurements of currents generated by 28 VDC voltages. More recently, in MEA architectures, power distribution systems of +/−270 VDC have been introduced. These MEA architectures include power conversion and distribution equipment for which DC inductors are needed as part of the power topology, at input or output stages, to improve power quality and/or meet EMI requirements. The present invention describes methods and apparatuses that modify a DC inductor, also known as a DC choke or a DC inductive filter, so that the DC inductor achieves functions of inductor and current sensor in one single integrated package.

Figure 1:
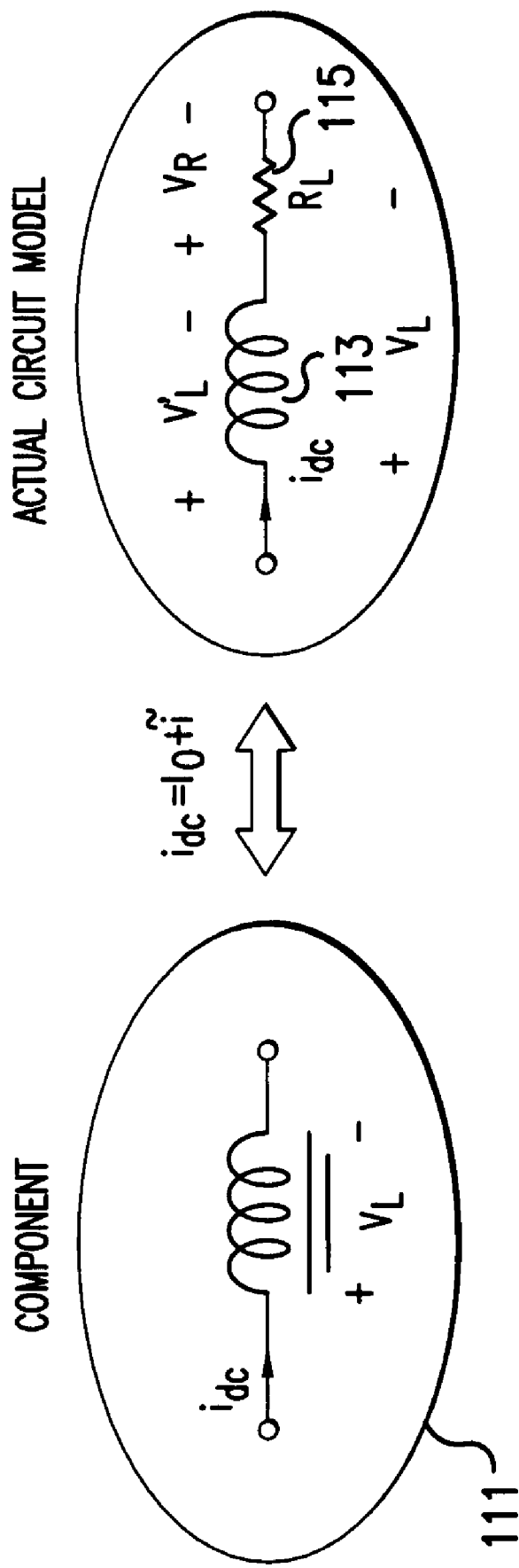
FIG. 1 illustrates design aspects for a DC inductor used in an integrated DC current sensor according to an embodiment of the present invention.

Aspects of the invention are more specifically set forth in the accompanying description with reference to the appended figures. FIG. 1 illustrates design aspects for a DC inductor used in an integrated DC current sensor according to an embodiment of the present invention. FIG. 1 illustrates the component level versus actual circuit model of a DC choke 111 that includes an inductor resistance $R_L$. As illustrated in FIG. 1, an inductor component 111 having a resistance can be represented by a circuit that includes an inductor 113 of inductance L and a resistor 115 of resistance $R_L$.

An important difference between AC and DC inductors is that DC inductors typically carry significant DC currents.

One important function of a DC inductor is to reject current ripple present on top of its DC current.

For an inductor component 111 having an inductance L and a resistance $R_L$ as illustrated in FIG. 1, the voltage $v_L$ over the inductor 111 can be expressed as:

$$v_L = L\frac{d(i_{dc})}{dt} - R_L(i_{dc}) \qquad (1)$$

where $i_{dc}$ is a DC current passing through the inductor component 111. From equation (1) it follows that:

$$di_{dc} = \frac{1}{L}(v_L - R_L i_{dc})dt \qquad (2)$$

Taking the integral on both sides of equation (2) and setting the integration limits to account for proper initial conditions, it follows that:

$$\int_{-\infty}^{t} di_{dc} = \int_{-\infty}^{t} \frac{1}{L}(v_L - R_L i_{dc})dt \qquad (3)$$

Therefore, $$i_{dc} = \int_{-\infty}^{t} \frac{1}{L}(v_L - R_L i_{dc})dt = \int_{-\infty}^{t} \frac{1}{L}v'_L dt \qquad (4)$$

where $v'_L$ is the voltage over the pure inductor element 113 in FIG. 1.

In the co-pending non-provisional application titled "Method and Apparatus for AC Integrated Current Sensor", the entire contents of which are hereby incorporated by reference, integrated inductor/current sensors for measuring AC currents were described. For such integrated AC inductor/current sensors, when the inductor resistance $R_L$ is much smaller than $\omega_0 L$ (where $\omega_0$ is the fundamental frequency associated with current and voltage waveforms passing through an AC inductor), it was shown that the "Volt×Second" across the AC inductor remains zero, and that the AC current through the AC inductor can be obtained by integrating the inductor voltage.

This approach, however, does not work for a DC inductor used to measure DC currents, due to a significant DC current component ($I_0$ in FIG. 1) that passes through the inductor. The DC current component introduces a big DC offset in the DC inductor voltage, as shown in equation (3). This DC current component cannot be fed directly to an integrator, because it causes integrator saturation. Unlike the case of an AC inductor, the average "Volt×Second" across a DC inductor does not remain zero.

Figure 6:
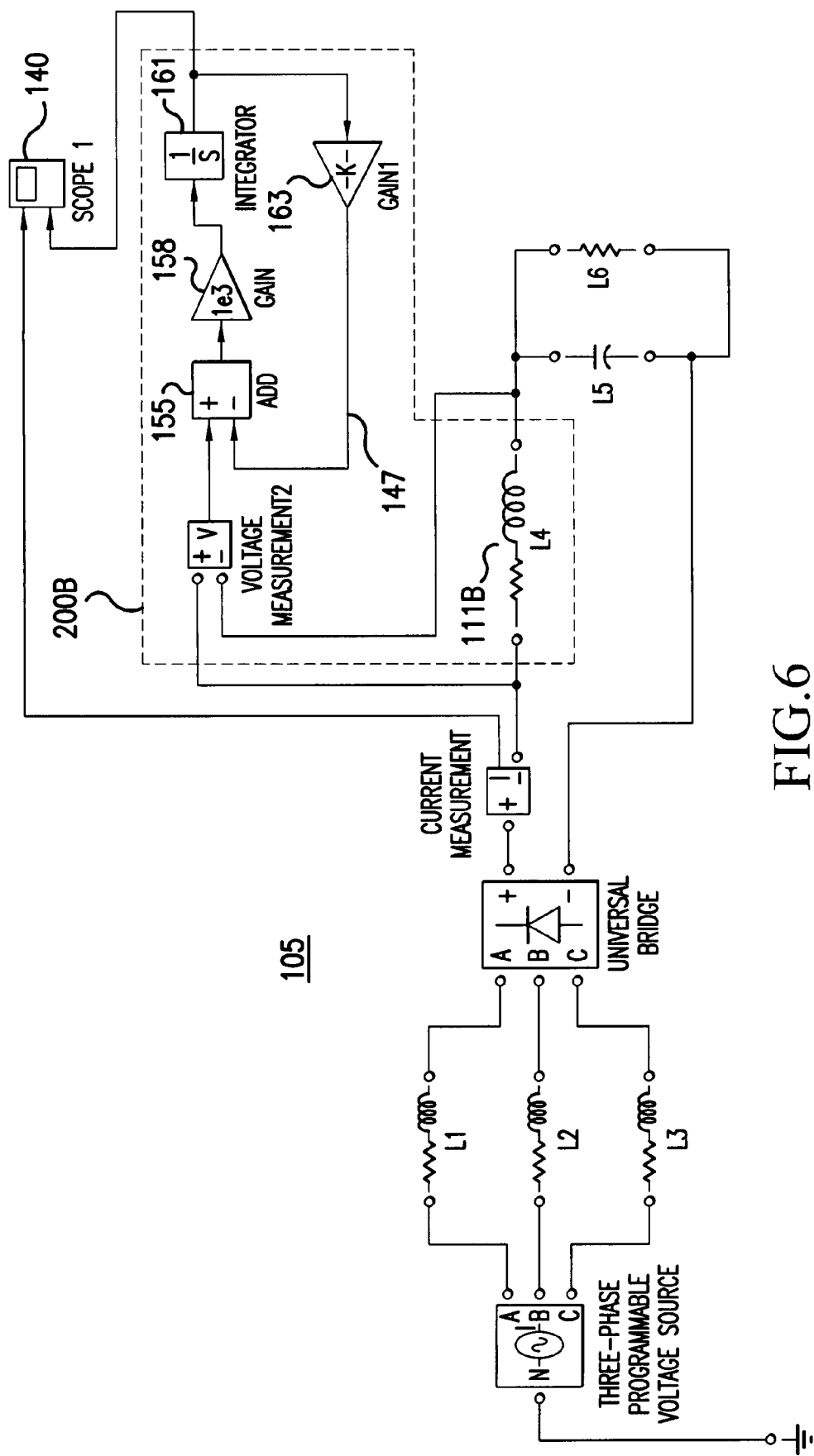
FIG. 6 illustrates a three phase passive rectifier circuit including an integrated DC current sensor according to an embodiment of the present invention.

The present invention presents methods and apparatuses for integrating a current sensor with a DC inductor to accurately measure a DC current. The present invention proposes a feedback loop as illustrated in FIGS. 4 and 6, to subtract the voltage drop across the equivalent resistor of the DC choke (i.e. $i_{dc}R_L$) and prevent saturation of the integrator circuit.

Figure 2:
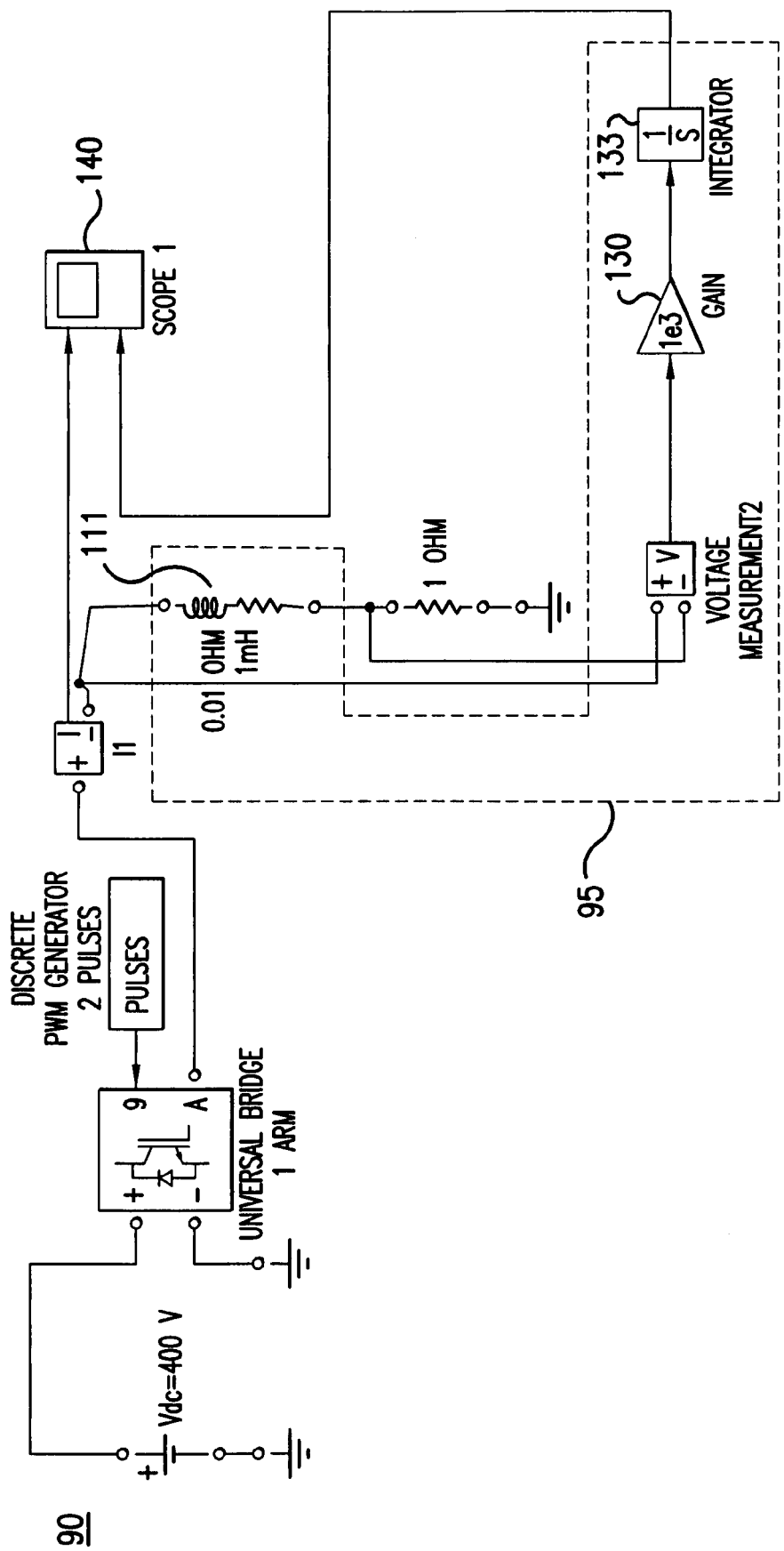
FIG. 2 illustrates a DC circuit in which an AC integrated current sensor is used to measure power system line DC currents by measuring the voltage across an inductor.

FIG. 2 illustrates a DC circuit 90 in which an AC integrated current sensor 95 is used to measure power system line DC currents by measuring the voltage across an inductor 111. The AC integrated current sensor 95 has been described in the co-pending non-provisional application titled "Method and Apparatus for AC Integrated Current Sensor", the entire contents of which are hereby incorporated by reference.

Figure 3A:
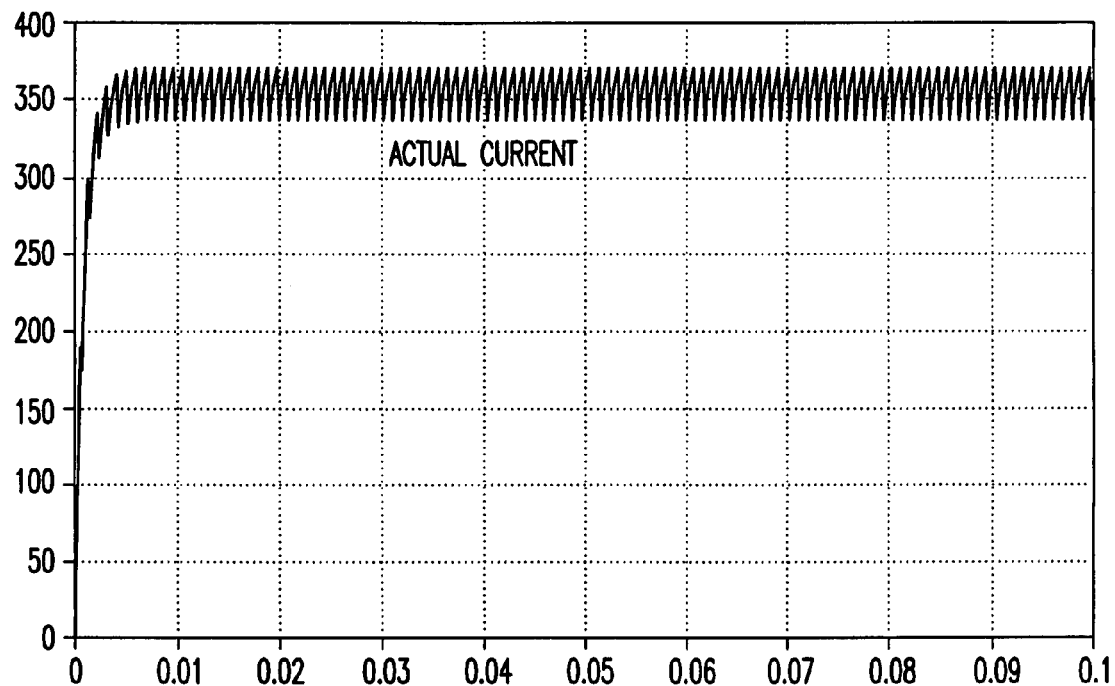
FIGS. 3A and 3B illustrate a comparison between a current measurement by a typical/conventional current sensor and a current measurement performed by an integrated AC current sensor for the DC circuit in FIG. 2.
Figure 3B:
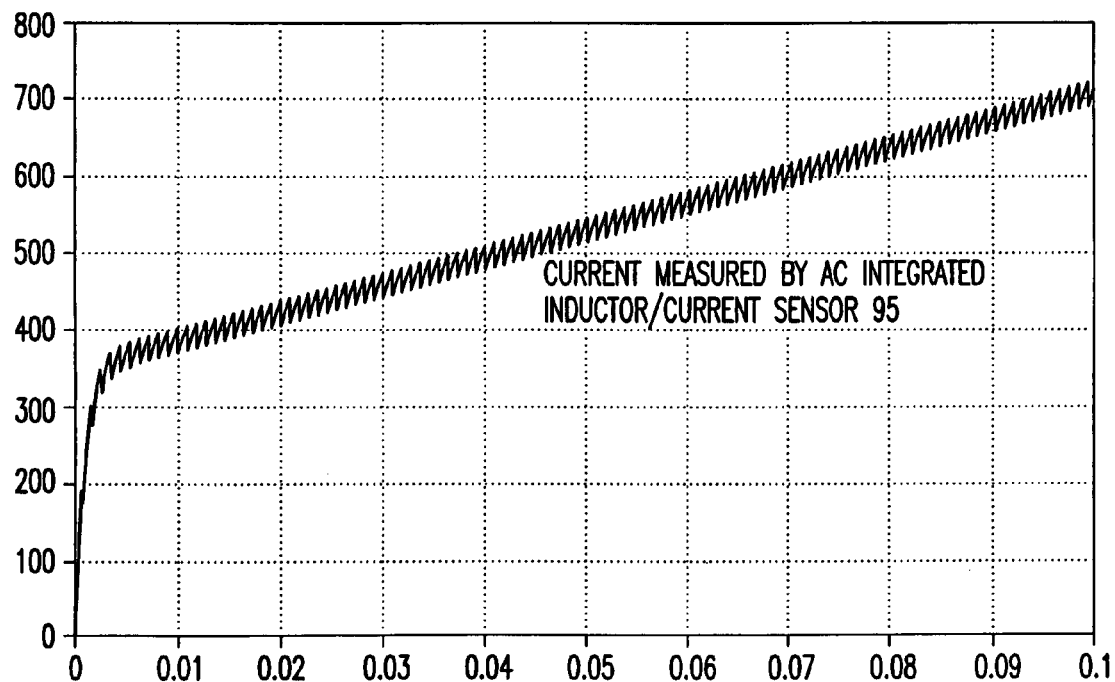

In FIG. 2, a DC/DC PWM converter is used to demonstrate that an AC integrated inductor/current sensor 95 cannot be used to measure a DC current. FIGS. 3A and 3B illustrate a comparison between a current measurement by a typical/conventional current sensor and a current measurement performed by the integrated AC current sensor 95 for the DC circuit in FIG. 2, when inductor 111 resistance is included. As it can be seen in FIGS. 3A and 3B, the current measured by the AC integrated current sensor 95 is different from the current measured by a conventional current sensor. This happens because integrator 133 gets saturated, due to the presence of a DC component in inductor current.

Figure 4:
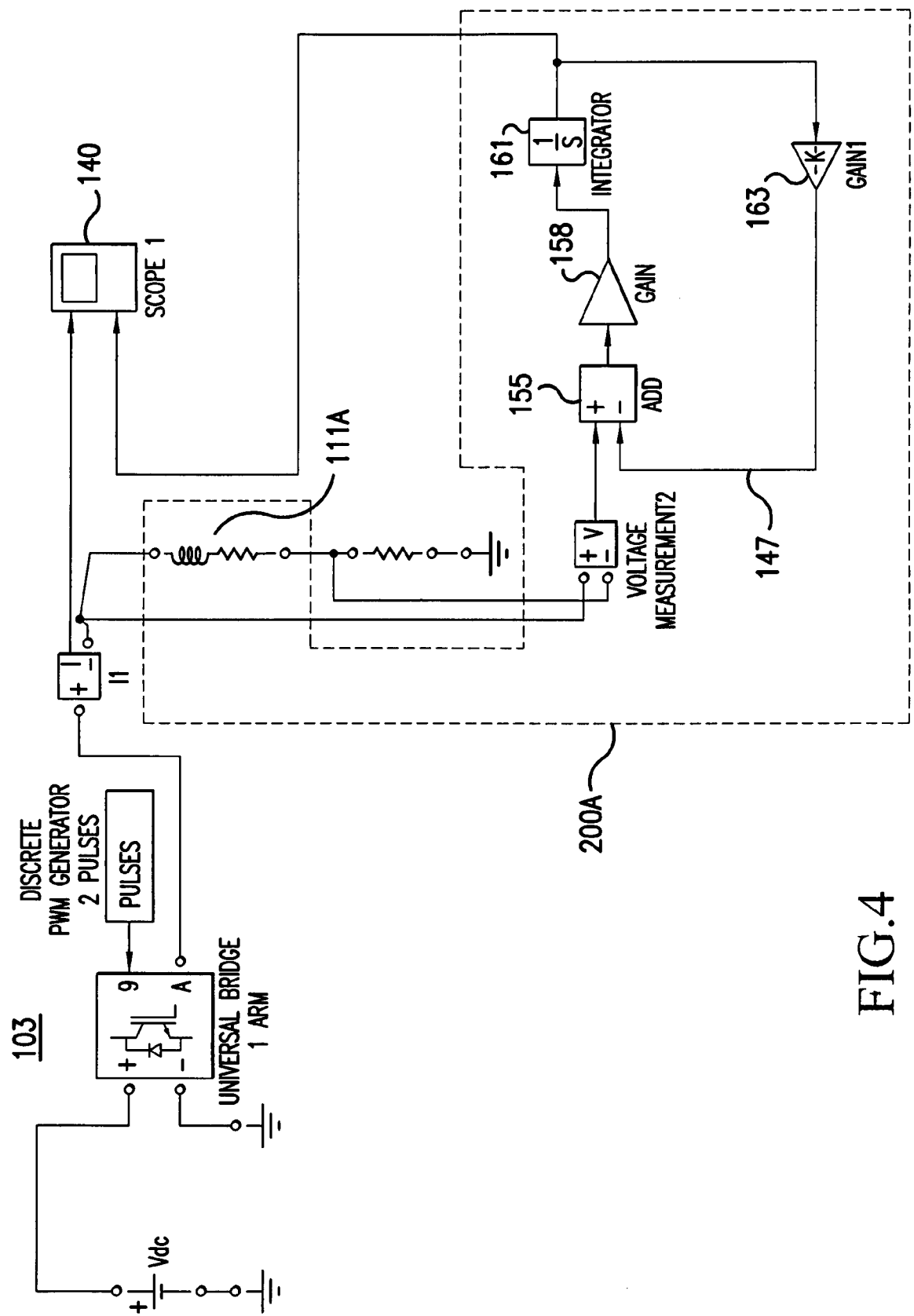
FIG. 4 illustrates how to introduce a feedback control loop to subtract the resistive-voltage-drop from a DC choke voltage, in order to obtain an integrated DC current sensor according to an embodiment of the present invention.

FIG. 4 illustrates how to introduce a feedback control loop to subtract the resistive-voltage-drop from a DC choke voltage, in order to obtain an integrated DC inductor/current sensor 200A according to an embodiment of the present invention. The integrated DC current sensor 200A includes the following components: an inductor 111A; an adder 155; gain control circuits 158 and 163; an integrator 161; and a feedback loop 147.

An exemplary PWM controlled DC-DC converter circuit 103 is used to illustrate how to introduce a feedback loop 147 in integrated DC current sensor 200A. The feedback loop 147 subtracts the resistive-voltage-drop from the DC choke voltage in order to obtain a "virtual inductor voltage" ($v'_L$ in FIG. 1). The "virtual inductor voltage" is further fed into integrator 161 to obtain a DC current measurement. The feedback loop 147 prevents saturation of the integrator 161 due to the DC component of the current in the current sensor 200A. Hence, the saturation problem discussed at FIGS. 2 and 3 is eliminated with this technique. The integrated DC current sensor 200A implements equations (1) to (4) described in connection with FIG. 1. In an alternative implementation, the order of gain control circuit 158 and integrator 161 is changed/reversed.

Figure 5A:
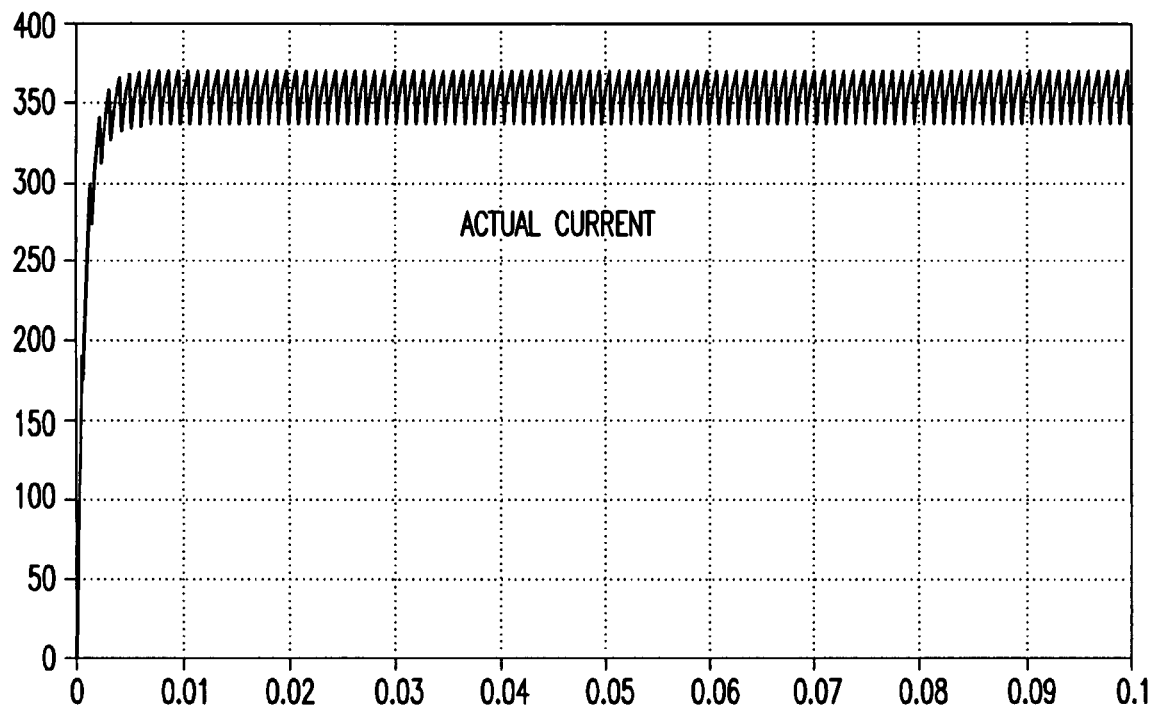
FIGS. 5A and 5B illustrate a comparison between a current measurement by a typical/conventional current sensor and a current measurement performed by an integrated DC current sensor for the DC circuit in FIG. 4, according to an embodiment of the present invention.
Figure 5B:
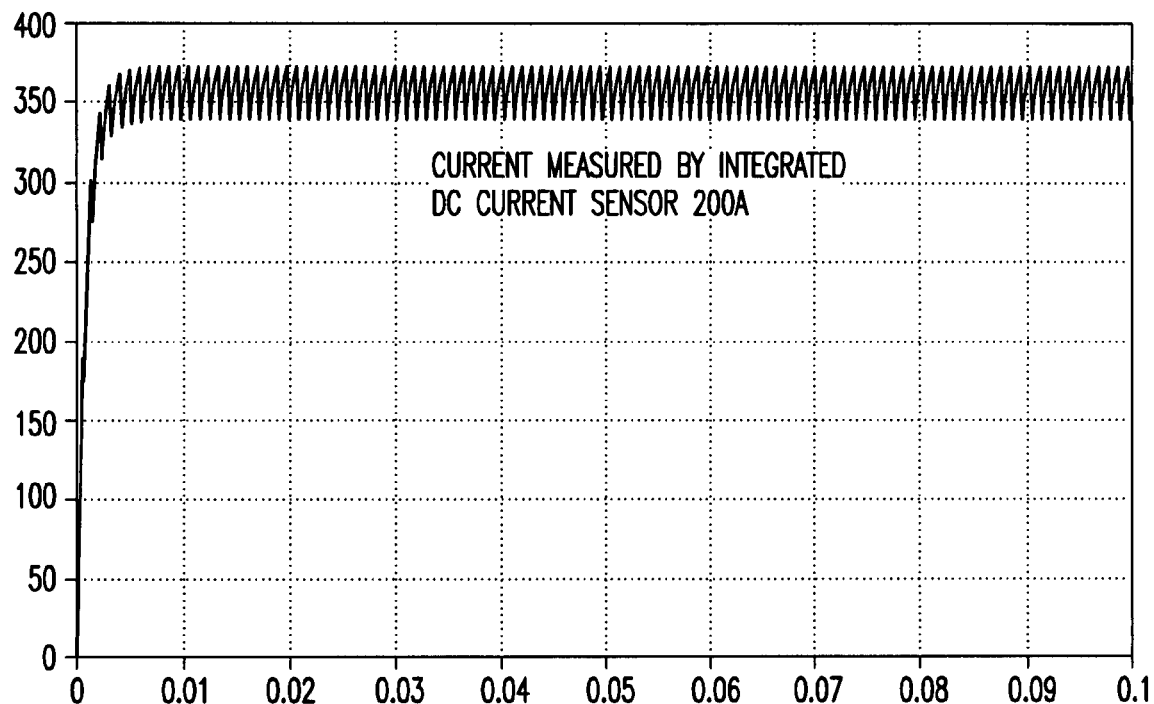

The DC/DC PWM converter circuit 103 is used to verify the conceptual design of the DC integrated inductor/current sensor 200A. FIGS. 5A and 5B illustrate a comparison between a current in circuit 103 measured by a typical/conventional current sensor, and a current measured by the integrated DC current sensor 200A, according to an embodiment of the present invention, with inductor 111A resistance included. FIGS. 5A and 5B show that the current waveform measured by the typical/conventional current sensor is very close in value and shape to the current waveform measured by the integrated DC current sensor 200A. This demonstrates proper operation of the integrated DC current sensor 200A.

Figure 7A:
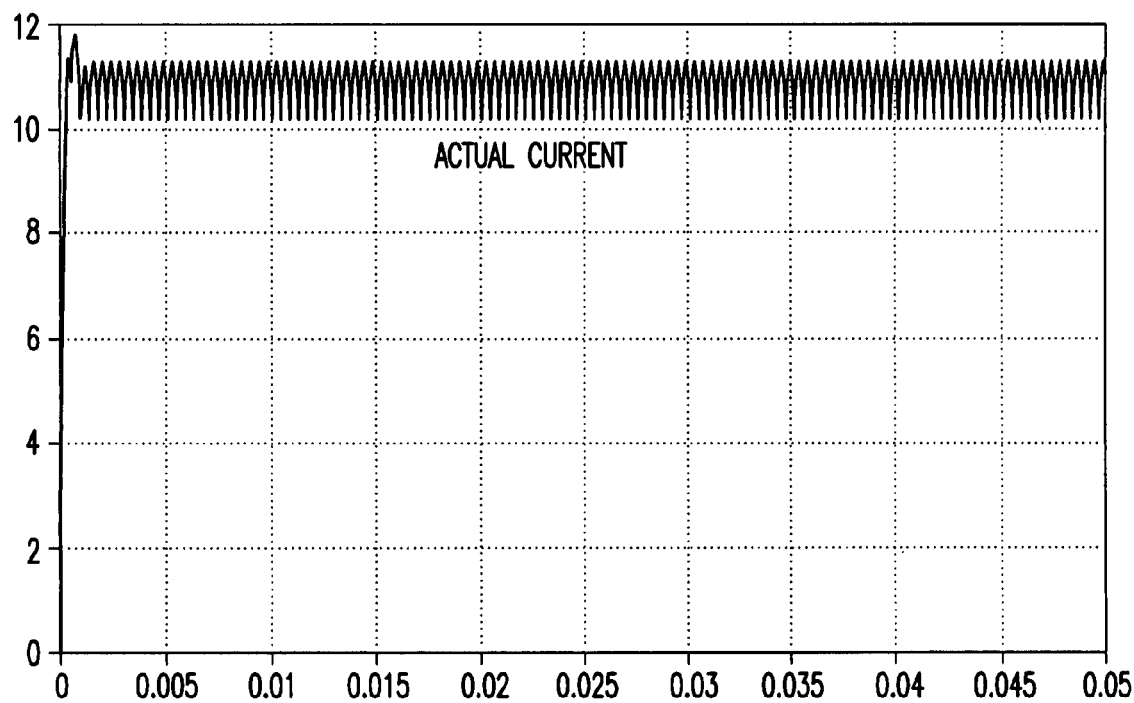
FIGS. 7A and 7B illustrate a comparison between a current measurement by a typical/conventional current sensor and a current measurement performed by an integrated DC current sensor for the circuit in FIG. 6, according to an embodiment of the present invention.
Figure 7B:
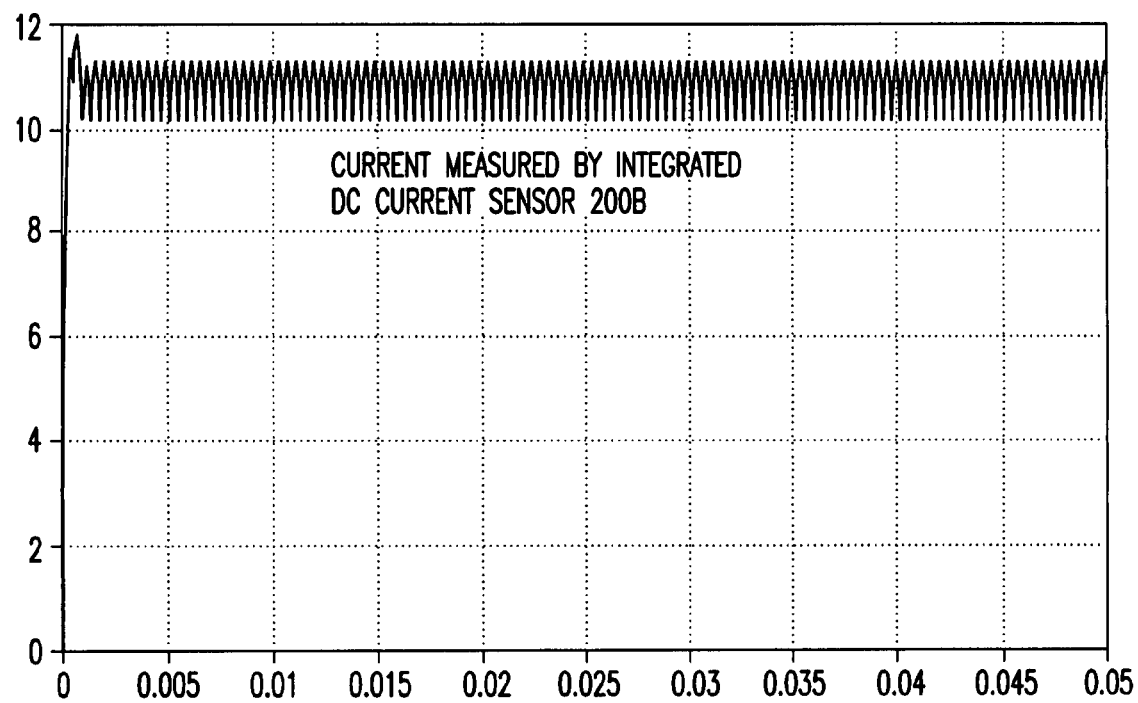

FIG. 6 illustrates a three-phase passive rectifier circuit 105 including an integrated DC current sensor 200B according to an embodiment of the present invention. FIGS. 7A and 7B illustrate a comparison between a current measurement by a typical/conventional current sensor and a current measurement performed by integrated DC current sensor 200B for the circuit 105 in FIG. 6, according to an embodiment of the present invention, with inductor 111B resistance included. FIGS. 6, 7A and 7B illustrate how to detect a DC link current by monitoring the DC link choke voltage, and show proper operation of the integrated DC current sensor 200B. The feedback loop 147 prevents saturation of the integrator 161 caused by a DC component of the current in inductor element L4 (111B). The saturation problem is eliminated and the voltage across the DC inductor 111B is monitored, to obtain a measurement of the DC current in the DC link.

As shown in FIGS. 7A and 7B, the current waveform measured by a typical/conventional current sensor is very close in value and shape to the current waveform measured by the integrated DC current sensor 200B. This demonstrates proper operation of the integrated DC current sensor 200B.

Figure 8:
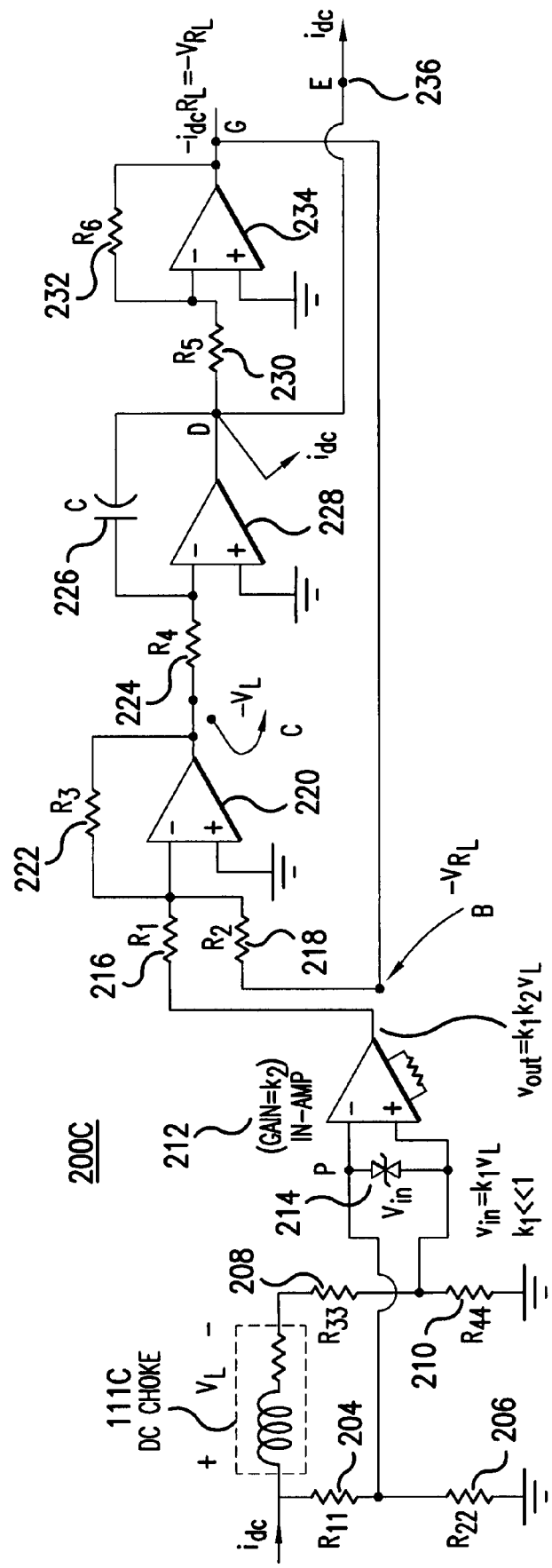
FIG. 8 illustrates an integrated DC current sensor according to a second embodiment of the present invention.

FIG. 8 illustrates an integrated DC current sensor 200C according to a second embodiment of the present invention. FIG. 8 illustrates a preferred embodiment of the present invention for a conceptual circuit implementation of an integrated DC inductor/current sensor.

The circuit 200C illustrated in FIG. 8 monitors high-side inductor voltage in a safe manner through a resistive network. An instrumentation-amplifier (IN-AMP) 212 is used to ideally detect only the difference in voltage between its input pins. Any common-mode signals (equal potentials for both inputs) such as noise or voltage drops in ground-lines are rejected at the input, without being amplified.

An AC transformer may pose challenges if used to step-down a DC inductor $v_L$ voltage for down-stream low voltage circuitry. A resistive network, such as the one shown in FIG. 8, can be used to step-down the DC inductor voltage for proper operation of down-stream circuits. In an alternative embodiment, an isolation op-amp can be used instead of the resistive network, to step-down the inductor voltage for proper operation of down-stream circuits.

For an initial stage gain $k_1 \ll 1$, $v_{in} = k_1 v_L$ and $v_{out} = k_1 k_2 v_L$, where $k_2$ is the gain of the IN-AMP 212. The resistances for the circuit in FIG. 8 obey the following mathematical relationships:

$$\frac{R_6}{R_5} = R_L \tag{5}$$

$$R_1 = R_2, \tag{6}$$

and $$\frac{R_3}{R_1} = \frac{R_4 C}{k_1 k_2 v_L}. \tag{7}$$

Hence, the op-amp system including amplifier 220, and resistors R1 and R3 inputs a voltage $k_1 k_2 v_L$ and outputs a voltage $v_L$. The integrator system including amplifier 228, resistor R4 and capacitor C outputs a current $i_{dc}$. Finally, the amplifier 234 outputs a voltage at point G of value $-i_{dc} R_L = -v_{R_L}$, $$\text{since } \frac{R_6}{R_5} = R_L,$$

where $R_L$ is the DC choke 111C resistance.

The resistance value R4 and capacitance value C determine the performance of the integrator portion for the circuit in FIG. 8. Parameters R4 and C can be selected to achieve good dynamic response and avoid saturation of the integrator. Parameters R4 and C, and other resistance and capacitance parameters associated with the circuit 200C, can be selected to bypass noise and eliminate offsets.

A transorb 214 is added to the DC inductor/integrated current sensor 200C to clamp potential over-voltages that may occur. Such over-voltages can be harmful to sensitive electronic parts that are connected to point P in the circuit.

Figure 9A:
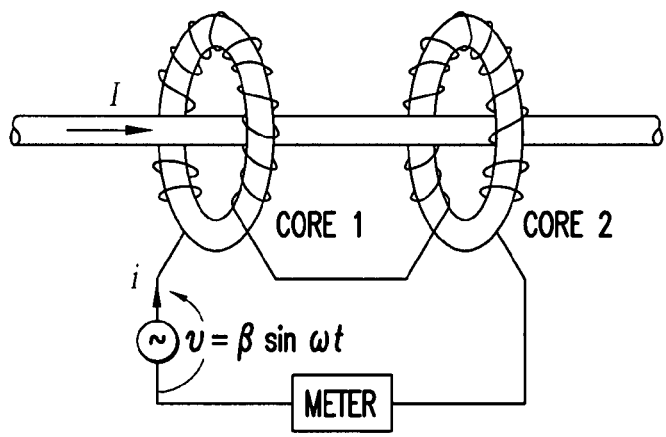
FIG. 9A illustrates a transductor circuit used for measuring DC current, for integration into a DC inductor/current sensor according to a third embodiment of the present invention.
Figure 9B:
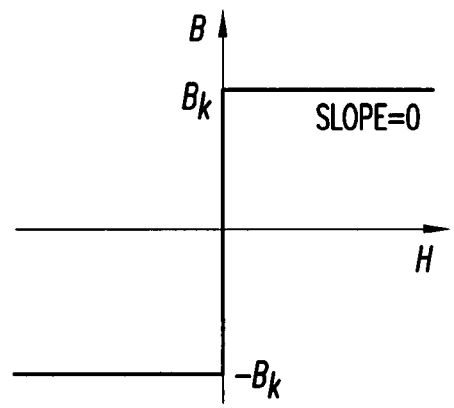
FIGS. 9B, 9C and 9D illustrate transductor properties.
Figure 9C:
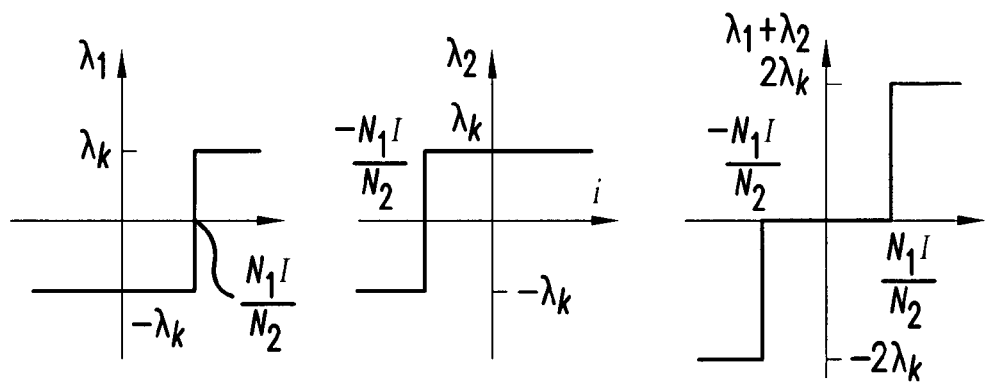
Figure 9D:
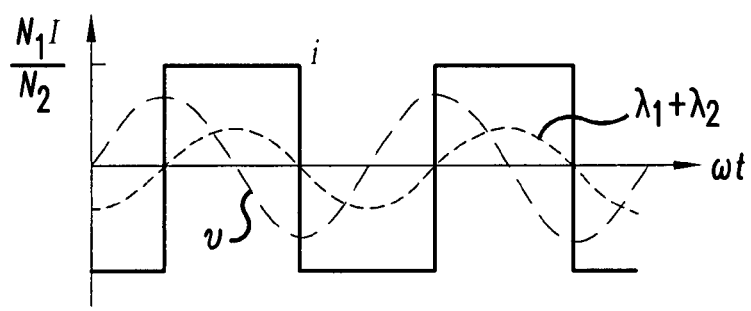

FIG. 9A illustrates a transductor circuit used for measuring DC current, for integration into a DC inductor/current sensor according to a third embodiment of the present invention. FIGS. 9B, 9C and 9D illustrate transductor properties. FIG.

9A illustrates a circuit arrangement for DC measurement using a transducer and FIG. 9B illustrates an idealized B-H relationship for the transductor. FIG. 9C illustrates flux linkages $\lambda_1$ for core 1 of the transductor, $\lambda_2$ for core 2 of the transductor, and $\lambda_1+\lambda_2$. FIG. 9D illustrates waveforms of source PD, total flux linkage, and current associated with a transductor. Transductors are described in more detail in "Measurement of DC Current", Section 2.13.3, p. 159, "Electric Machines", by G. R. Slemon and A. Stranghen, $3^{rd}$ printing, June 1981, Addison-Wesley Publishing, the entire contents of which are hereby incorporated by reference. According to embodiments of the current invention, a transductor can be integrated in the same DC inductor package to obtain a DC integrated current sensor.

Traditional current sensors come in many different forms and implementations, such as: DC current transductors using two saturable magnetic cores and an external source of AC excitation, as shown in FIG. 9A; Hall Effect current sensors; shunt resistors; non-contact current sensors using surface-mount IC technology; etc. Some of these current sensors have been described/identified in the co-pending non-provisional application titled "Method and Apparatus for AC Integrated Current Sensor", the entire contents of which are hereby incorporated by reference. Typical/conventional current sensors suffer from one or more of the following problems: circuit complexity; excessive power dissipation; excessive cost; sensitivity to ambient temperature; lack of galvanic isolation; lack of accuracy due to temperature or circuit parameter variations (i.e., lack of compensation/corrective circuitry to account for these variations); lack of dynamic range (resolution problems at low/high end current measurements) and dynamic response (excessive time-delays); saturation problems due to overload; requirements for DC power bus splitting and/or additional mounting hardware that increase cost and weight.

Typical/conventional current sensors can be integrated with a DC inductor in one package, to obtain an integrated DC inductor/current sensor and improve the performance of the sensors, according to embodiments of the current invention. For example, series shunt resistors can be integrated with a DC inductor in one package, to obtain a DC integrated current sensor. For additional integration, the power supply voltage can be designed to be supplied to the DC integrated current sensor from the line AC and/or DC side, and to reside within the same package as the DC integrated current sensor. Additional integration techniques for typical/conventional current sensors and inductors are described in the co-pending non-provisional application titled "Method and Apparatus for AC Integrated Current Sensor", the entire contents of which are hereby incorporated by reference.

Packaging of a conventional DC current sensor with an inductor results in ease of manufacturing and ease of installation. Moreover, a conventional current sensor packaged with an inductor requires less thermal management equipment than individual current sensors and inductors. An integrated package including a current sensor and an inductor uses common elements such as core external packaging, etc., between the current sensor and the inductor, which reduces cost and weight. Furthermore, integration reduces parts-count and eliminates stand-alone current sensors. Stand-alone current sensors present multiple drawbacks. They are very expensive, bulky, and heavy; they require additional space and custom H/W such as interconnecting bus-bars/cables and other mounting fixtures for proper installation and thermal management. Thermal management is particularly difficult to achieve for stand-alone AC current sensors, due to trapped heat generated by internal power dissipation. Trapped heat is a significant problem in electric power systems, and particularly so in high power applications.

Figure 10:
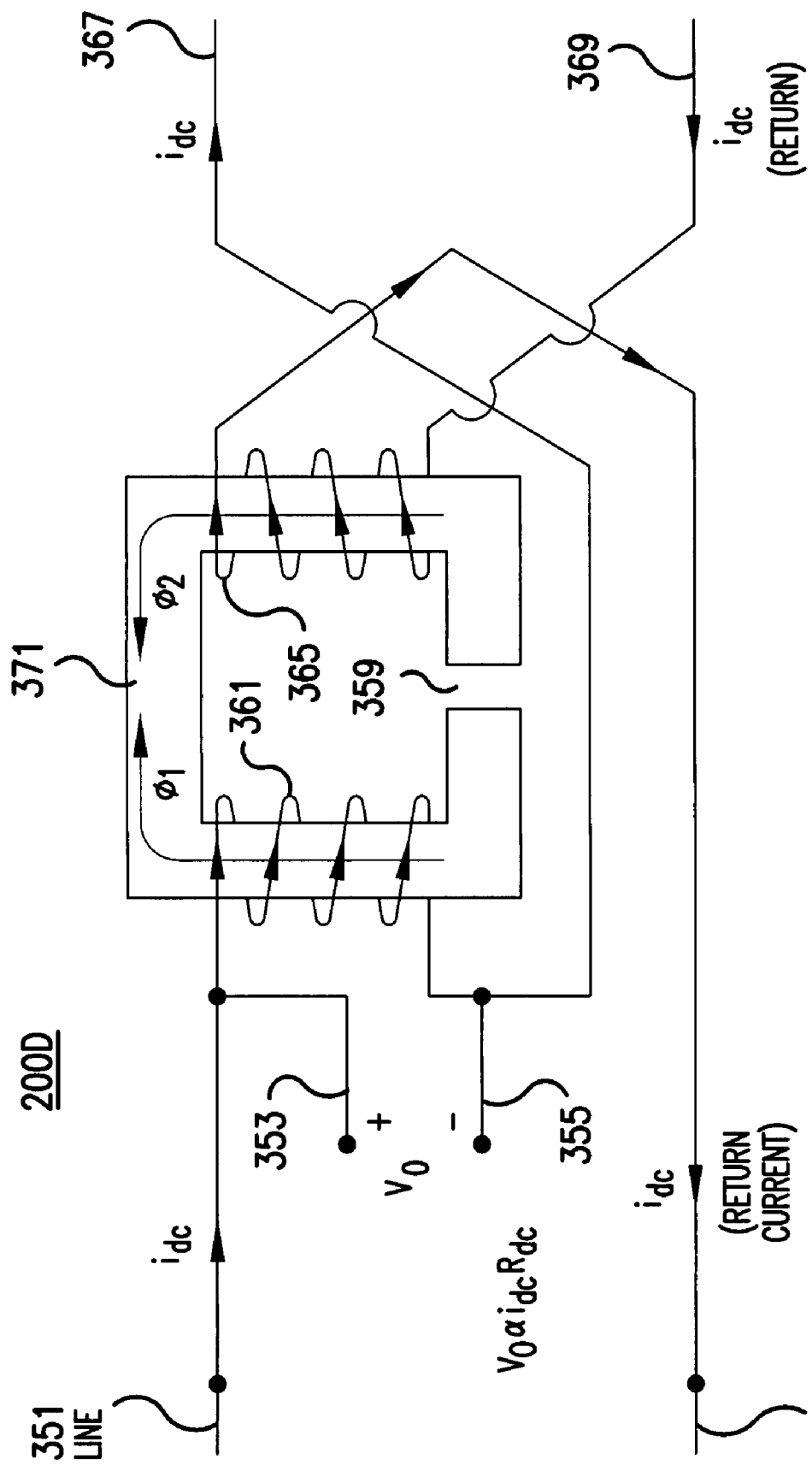
FIG. 10 illustrates a common-mode choke used for detecting AC and/or DC current directly, without a need for an integrating circuit, according to a fourth embodiment of the present invention.

FIG. 10 illustrates a common-mode choke used for detecting AC and/or DC current directly, without a need for an integrating circuit, according to a fourth embodiment of the present invention. The common-mode choke illustrated in FIG. 10 includes: a core 371 with an airgap 359; a first winding 361; a second winding 365; input line 351; output line 367; and return lines 369 and 357. The second winding 365 for the common-mode choke is introduced to measure DC or AC current in the same manner as a current transformer. This winding arrangement is advantageous because the inductor and the current transformer share the core and the primary winding. Hence, only one simplified installation and one thermal management system are required for the integrated inductor/current sensor 200D.

A single phase AC or DC integrated inductor/current sensor 200D is implemented using the terminal voltage of the common-choke inductor. While the integrated DC current sensors described in the previous figures of this application integrate current sensors into a differential inductor, the integrated inductor/current sensor 200D illustrated in FIG. 10 uses a common-mode inductor. The advantage of using a common-mode inductor is that the sensed voltage across one of the windings (e.g., $V_0$ in FIG. 10) is directly proportional to the winding resistance $R_{dc}$ (when common-mode current is negligible), and hence no further integration is required. Moreover, if the low-side winding is used, high-voltage isolation is not required, which further simplifies the implementation of the integrated inductor/current sensor 200D. The integrated inductor/current sensor 200D allows detection of line current under normal mode of operation. The integrated inductor/current sensor 200D also allows the user to properly design the protection/sensing circuitry to be able to monitor (advantageously, through a single current sensor) other abnormal modes of operation, when excessive common-mode currents are flowing in the system. For example, the integrated inductor/current sensor 200D may be advantageously used to detect a common-mode (ground fault). Under this condition, there would be significant flux in the magnetic core, and an excess voltage for $V_0$ can be monitored to detect such a fault condition.

As illustrated in FIG. 10, on the common-mode inductor 200D (either DC or AC), the "line" and "return" wires are twisted together and wound on core 371, usually with an airgap. The airgap is used to prevent core saturation, by making the inductor operate in the linear region of the B-H curve. A core with an airgap can be implemented by many different techniques, and in a variety of shapes.

When the "common-mode" current is negligible (i.e. when the "line" and "return" currents are equal, or are very close), $V_0$ is proportional to the winding resistance. Fluxes $\Phi_1$ and $\Phi_2$ cancel each other and there is no inductance when common-mode current is negligible.

The method and apparatus described at FIG. 10 are also applicable to 3-phase AC line power, as 3-phase incoming wires can be twisted together and then wound around the core. In this implementation, the sensed $V_0$ is usually a small voltage (similar to a sensing voltage across a sense shunt resistor). The sensed $V_0$ can be fed into an IN-AMP using circuits described at FIG. 9.

Figure 11:
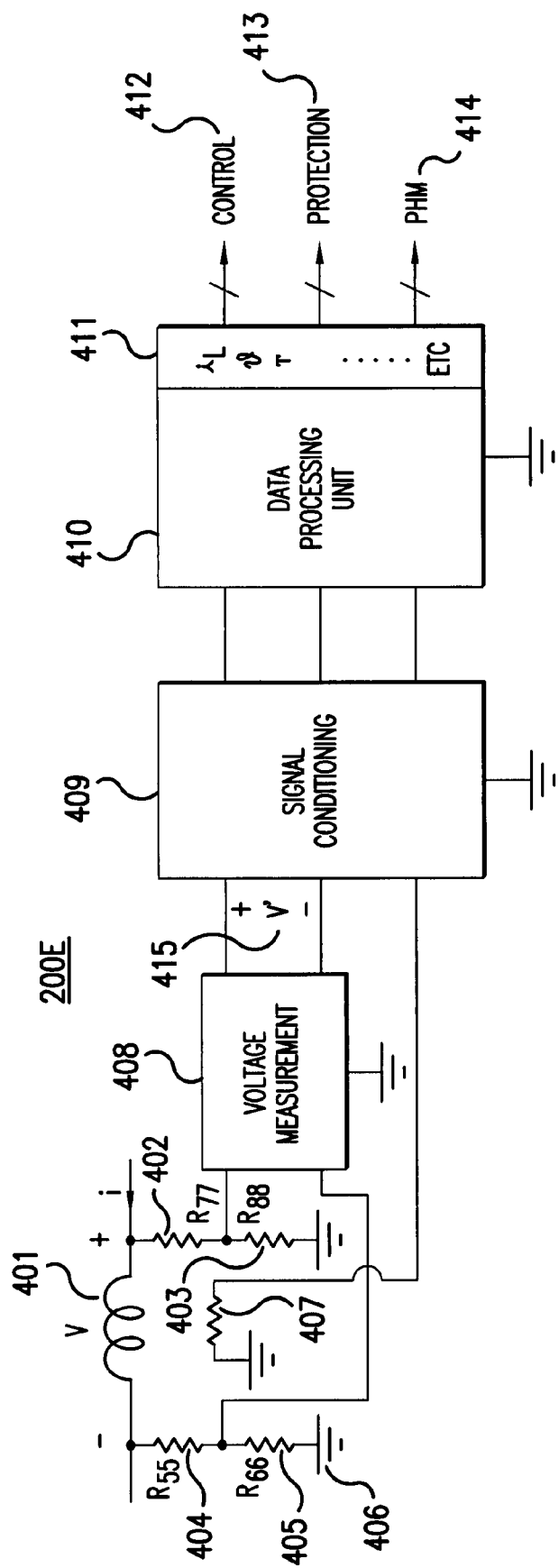
FIG. 11 illustrates a conceptual circuit diagram for an integrated current sensor which demonstrates integration of measurement and transmission of additional electric power in the same inductor/current sensing package, according to a fifth embodiment of the present invention.

FIG. 11 illustrates a conceptual circuit diagram for an integrated current sensor 200E which demonstrates integration of measurement and transmission of additional electric power in the same inductor/current sensing package, according to a fifth embodiment of the present invention. FIG. 11 illustrates another preferred embodiment for an integrated DC inductor/current sensor. One DC choke 401 is shown in FIG. 11. DC current sensing is achieved by feeding a voltage (v' at point 415) proportional to the inductor voltage (v) to a data processing unit 410, after measurement in a voltage measurement unit 408, and signal conditioning in unit 409. Signal integration, gain adjustment, and feedback processing to subtract the resistive-voltage-drop from the DC choke voltage are achieved in block 410. Block 410 may comprise hardware and software/firmware items such as ASIC, FPGA, Microprocessors, Digital Signal Processors, etc.

Element 407 is a Resistive Temperature Detector (RTD) which is introduced in the integrated package of sensor 200E, to detect the worst case temperature for Prognostics Health Monitoring (PHM). Block 410 can also use received information to detect other electrical parameters, such as, for example, electrical parameters associated with the DC line. This information can be locally used or bundled together with other similar measurements (real-time inductor temperature, point-of-regulation (POR) DC system voltage, etc.) from other DC lines, and communicated to an external unit for control (412), protection (413), and/or PHM (414). Control sequencing, and prognostic health monitoring and diagnostics for fault tolerant operation can be implemented with an electronics-based system that controls transitions between a plurality of operating modes to ensure fail-safe operation without unnecessary tripping, cold-starts or system resets upon the occurrence of certain fault conditions, etc., the electronics-based system including a prognostic health monitoring and diagnostic unit that identifies present out-of-range conditions, overload conditions, and trending violations, for components of the system. Such an electronics-based system for prognostic health monitoring is described in the US Patent application 20030204777 titled "Control Sequencing and Prognostics Health Monitoring for Digital Power Conversion and Load Management" filed on Apr. 14, 2003, the entire contents of which are hereby incorporated by reference.

The present invention describes multiple methods and apparatuses for integrated DC inductor/current sensors that achieve both inductive and current sensing functions, by modifying a DC inductor to measure DC current in the same integrated package. Hence, the need for a separate DC current sensor is eliminated. Methods and apparatuses for integrated DC inductor/current sensors presented in the current application provide the following additional benefits. The integrated DC inductor/current sensors presented in the current application are highly accurate, cost-effective, and lightweight. Instead of a current measurement, a voltage is measured and a linear current-to-voltage transformation provides data to determine the current. The integrated DC inductor/current sensors presented herein have wide-dynamic current/temperature range, as the DC inductor does not typically saturate. Moreover, effects of parameter variation can be corrected, for example with a look-up table. Galvanic isolation can be incorporated into the integrated current sensors by resistive networks or isolation op-amps. Compensation circuits, such as, for example, look-up table based circuits, can be incorporated into the integrated current sensors, to compensate for parameter variations due to, for example, temperature variations. Failure modes caused by transformers are eliminated. An example of a transformer failure mode is the event in which a secondary winding is opened and induces high voltages at the output of the transformer. With the integrated current sensors of the present invention, significant reductions in cost, weight, volume, and power dissipation in electric power systems are achieved.

Conventional/traditional current sensing systems cause significant problems in high power applications. Stand-alone conventional/traditional high current rating DC current sensors present multiple drawbacks. They are expensive, bulky and heavy. They also require additional custom H/W such as interconnecting bus-bars/cables and other mounting fixtures for proper installation and thermal management. Thermal management is particularly difficult to achieve for stand-alone DC current sensors, due to trapped heat generated by internal power dissipation. Trapped heat is a significant problem in electric power systems, and particularly so in high power applications.

The integrated inductor/current sensors described in the current invention address these and other problems. The integrated inductor/current sensors described in the current invention are easy to install, and provide thermal management. Integration of inductive and current sensing functions in one package reduces parts-count and eliminates standalone current sensors. Expensive and heavy current sensors, bus-bars, cables, and other mounting fixtures typically used for current sensing are eliminated. An electric power system including integrated DC inductor/current sensors described in the current invention, is not disturbed at two different places, for introducing two different components (an inductor, and a current sensor) in the system. Using the integrated DC inductor/current sensors, an inductor and a current sensor are introduced at one location in a single package, in an electric power system.

Using methods and apparatuses of the current invention, traditional DC current sensors, such as current transformers, Hall Effect current sensors, shunt resistors, non-contact current sensors, or other current sensing means, can be integrated into a single package with a DC inductor to achieve an integrated inductor/current sensor that performs functions of DC inductor and current sensor in one package.

Integrated DC inductor/current sensors described in the current invention reduce overall cost, weight, and system complexity for electric power systems, eliminate temperature sensitive, heavy, bulky and expensive DC current sensors traditionally used to detect DC currents, allow reductions in parts count/inventory, facilitate manufacturing and testability, provide highly accurate current measurements, are lightweight, and have wide current/temperature range. These benefits are particularly significant for high power current sensing applications, as significant power dissipation in separate sensor components is being avoided. Other electrical/mechanical parameters of interest, such as inductor temperature and point-of-regulation (POR) voltage, can be integrated for measurement/processing into the inductor/current sensor package, to allow for temperature compensation and/or current magnitude correction circuitry. These measured or inferred analog and/or discrete signals (i.e. line current, DC system voltage, inductor temperature, etc.) can be sent to a controller through individual analog/discrete signals, or bundled together and sent through low cost serial communication ports, or through wireless communication or Power Line Carrier Methods, depending on the application. This level of integration is highly cost-effective and reduces cost and weight for remote current sensing applications, because it can improve signal-to-noise ratio, and eliminate cross-talk and signal degradation due to long analog/discrete signal wires.

Using methods and apparatuses of the current invention, inductor voltage after signal conditioning can be digitized and fed to a suitable data-processing unit that integrates the inductor voltage to obtain the inductor current, as described at FIG. 11. Electrical circuits such as H/W only based systems, differential-amplifiers or instrumentation-amplifiers, embedded control systems based on both H/W and S/W such as FPGAs, ASICs, Microprocessors or Digital Signal Processors, etc., can be used to implement integrated inductor/current sensors described in the current invention. Electrical parameters of interest, such as real-time inductor temperature, point-of-regulation (POR), DC system voltage, etc., can be integrated for control or PHM, into the inductor/current sensor packages of the current invention.

Although detailed embodiments and implementations of the present invention have been described above, it should be apparent that various modifications are possible without departing from the spirit and scope of the present invention. Integrated DC inductor/current sensors described in the current invention may be used in a variety of applications. Integrated DC inductor/current sensors described in the current invention may be used, for example, in high current sensing applications. Any other methods including, but not limited to, electrical circuits or embedded control systems, can be used to realize the described functions of different blocks illustrated in the figures of the present invention. Such electrical circuits may be circuits based on H/W items, such as differential-amplifiers or instrumentation-amplifiers. Embedded control systems may be systems based on both hardware and firmware/software. Such embedded control systems include FPGAs, ASICs, Microprocessors, Digital Signal Processors, etc.

I claim:

1. An integrated current sensor for use in a DC electric power system, said current sensor comprising:
   a DC inductor including a resistive component and an inductive component, wherein a DC current passes through said DC inductor;
   an integrator circuit, said integrator circuit receiving a voltage associated with said DC inductor;
   a feedback system operationally connected to said DC inductor and to said integrator circuit, said feedback system subtracting a voltage associated with said resistive component and obtaining a voltage associated with said inductive component;
   a signal conditioning unit operationally connected to said DC inductor, said signal conditioning unit digitizing a second voltage proportional to a first voltage associated with said DC inductor, and outputting a third voltage; and
   a data processing unit in inputting said third voltage, wherein said data processing unit
   performs integration for said third voltage, and
   outputs at least one signal for parameter variation compensation, control, protection, or Prognostics Health Monitoring.

2. The current sensor according to claim 1, wherein a voltage output of said integrator circuit is proportional to said DC current.

3. The current sensor according to claim 1, wherein said feedback system includes:
   an adder system operationally connected to said DC inductor, and
   a gain control circuit connected to the output of said integrator circuit and to an input of said adder system.

4. The current sensor according to claim 1, wherein said feedback system prevents saturation of said integrator circuit due to said DC current.

5. The current sensor according to claim 1, wherein a signal output by said current sensor is sent to a controller through individual analog/discrete signals, or bundled together and sent through low cost serial communication ports, or through wireless communication, or Power Line Carrier Methods.

6. The current sensor according to claim 1 wherein the integrator circuit outputs an electrical parameter proportional to said DC current; and
   the feedback circuit is connected to said integrator circuit, to obtain a voltage associated with said inductive component.

7. The current sensor according to claim 6, further comprising a resistive network connected to said DC inductor, or an isolation operational amplifier operationally connected to said DC inductor, to step-down a voltage associated with said DC inductor.

8. The current sensor according to claim 6, further comprising an instrumentation-amplifier operationally connected to said DC inductor, said instrumentation-amplifier
   detecting the difference in voltage between its input pins and rejecting common-mode signals present at both input pins, and
   rejecting noise or voltage drops in ground-lines present at said both input pins.

9. The current sensor according to claim 6, wherein said integrator circuit and said feedback circuit include resistors whose resistance values are selected based on resistance of said resistive component and inductance of said inductive component.

10. The current sensor according to claim 6, wherein said integrator circuit and said feedback circuit each include an amplifier.

11. The current sensor according to claim 6, wherein electrical parameters including real-time inductor temperature, or point-of-regulation (POR) system voltage are integrated for parameter variation compensation or control or Prognostics Health Monitoring into said current sensor.

12. The current sensor according to claim 1, further comprising:
   a voltage measurement unit receiving said first voltage and outputting said second voltage, and
   a resistive temperature detector to detect worst case temperature for Prognostics Health Monitoring.

13. The current sensor according to claim 1, wherein said data processing unit
   performs feedback processing for said third voltage, to subtract a voltage associated with a resistive component of said DC inductor, and integration to obtain said DC current, and
   comprises hardware and/or software/firmware items such as differential-amplifiers, instrumentation-amplifiers, ASIC, FPGA, Microprocessor, or Digital Signal Processor.

14. The current sensor according to claim 1, wherein electrical parameters including real-time inductor temperature, or point-of-regulation (POR) system voltage are integrated for parameter variation compensation or control or Prognostics Health Monitoring into said current sensor.

15. The current sensor according to claim 1, wherein a signal output of said current sensor is sent to a controller through individual analog/discrete signals, or bundled together and sent through low cost serial communication ports or through wireless communication or Power Line Carrier Methods.

16. The current sensor according to claim 1 comprising:
a magnetic core;
a first winding wound around said core, said first winding carrying a DC current;
a second winding wound around said core, said second winding carrying a current proportional to said DC current; and
terminals connected to said first or second winding, to output a voltage proportional to said DC current.

* * * * *